(12) United States Patent
Kaneko

(10) Patent No.: US 10,446,365 B2
(45) Date of Patent: Oct. 15, 2019

(54) METHOD OF VERIFYING OPERATION PARAMETER OF SCANNING ELECTRON MICROSCOPE

(71) Applicant: NGR Inc., Yokohama (JP)

(72) Inventor: Koji Kaneko, Yokohama (JP)

(73) Assignee: NGR INC., Yokohama (JP)

( * ) Notice: Subject to any disclaimer, the term of this patent is extended or adjusted under 35 U.S.C. 154(b) by 0 days.

(21) Appl. No.: 16/021,017

(22) Filed: Jun. 28, 2018

(65) Prior Publication Data
US 2019/0006145 A1  Jan. 3, 2019

(30) Foreign Application Priority Data
Jun. 29, 2017  (JP) ................. 2017-127406

(51) Int. Cl.
| | |
|---|---|
| G06T 7/13 | (2017.01) |
| H01J 37/22 | (2006.01) |
| G06T 7/60 | (2017.01) |
| H01J 37/28 | (2006.01) |
| H01J 37/21 | (2006.01) |

(Continued)

(52) U.S. Cl.
CPC ............ *H01J 37/222* (2013.01); *G06T 7/13* (2017.01); *G06T 7/60* (2013.01); *H01J 37/21* (2013.01); *H01J 37/265* (2013.01); *H01J 37/28* (2013.01); *G06T 2207/10061* (2013.01); *G06T 2207/30168* (2013.01); *H01J 37/20* (2013.01); *H01J 2237/1501* (2013.01); *H01J 2237/1532* (2013.01); *H01J 2237/216* (2013.01); *H01J 2237/221* (2013.01)

(58) Field of Classification Search
None
See application file for complete search history.

(56) References Cited

U.S. PATENT DOCUMENTS

2011/0147586 A1* 6/2011 Fukuda .............. H01J 37/153
 250/310
2011/0243424 A1* 10/2011 Wu ..................... G03F 1/84
 382/144

(Continued)

FOREIGN PATENT DOCUMENTS

| JP | 2008-164593 A | 7/2008 |
|---|---|---|
| JP | 2010-268009 A | 11/2010 |
| JP | 2012-112974 A | 6/2012 |

*Primary Examiner* — Eileen M Adams
(74) *Attorney, Agent, or Firm* — Lathrop Gage LLP

(57) ABSTRACT

A method capable of verifying whether operation parameters, such as a focus parameter and an astigmatism correction parameter, of a scanning electron microscope are correctly adjusted. This method includes: determining a ratio of a length of an edge in a first direction to a length of the edge in a second direction perpendicular to the first direction, the edge being an edge of a pattern selected from design data; generating images of the pattern while changing an operation parameter of a scanning electron microscope; calculating an edge sharpness in the first direction of each of the images and calculating an edge sharpness in the second direction of each of the images; determining a ratio of a peak value of the edge sharpness in the first direction to a peak value of the edge sharpness in the second direction; and emitting an alarm if the ratio of the peak values does not coincide with the ratio of the lengths of the edge.

3 Claims, 12 Drawing Sheets

(51) Int. Cl.
*H01J 37/26* (2006.01)
*H01J 37/20* (2006.01)

(56) References Cited

U.S. PATENT DOCUMENTS

2011/0303843 A1* 12/2011 Omori .................... G01B 15/04
250/307
2016/0034784 A1* 2/2016 Ohmura ........... G08B 13/19613
382/103

* cited by examiner

METHOD OF VERIFYING OPERATION PARAMETER OF SCANNING ELECTRON MICROSCOPE

CROSS REFERENCE TO RELATED APPLICATION

This document claims priority to Japanese Patent Application No. 2017-127406 filed Jun. 29, 2017, the entire contents of which are hereby incorporated by reference.

BACKGROUND

An image generation system equipped with a scanning electron microscope is widely used for imaging patterns (interconnect trenches, contact holes, etc.) formed on a surface of a wafer. Automatic focusing and automatic astigmatism adjustment in a conventional scanning electron microscope are achieved by acquiring a plurality of images while changing related operation parameters and adopting operation parameters that result in the highest image-quality evaluation value.

One example of the image-quality evaluation is a method of calculating an edge sharpness of a pattern appearing on an image. The edge sharpness is obtained by scanning the image in a direction perpendicular to a direction in which the edge extends to obtain brightness values, calculating derivative values of the brightness values, and adding up the obtained derivative values. In the scanning electron microscope, unlike optical instruments, astigmatism, lens axis alignment, etc. may change. Therefore, it is important to evaluate the image quality by calculating the edge sharpness in multiple directions.

However, since the image generation system does not recognize an actual shape of a pattern, it is impossible to compare the actual shape of the pattern with a pattern appearing on an image. As a result, the image generation system may fail to obtain the optimum values of the operation parameters. Several examples will be described below with reference to drawings.

FIG. 14 is a diagram showing an example of an image of a grid pattern generated by a scanning electron microscope. In this example, edges of the pattern are uniformly present in a vertical direction and a horizontal direction. FIG. 15 is a diagram showing edge sharpness in four directions of 0°, 90°, 45°, and 135° of the pattern image shown in FIG. 14. In this example, the horizontal direction is defined as an angle of 0°. In FIG. 15, the vertical axis represents edge sharpness, and the horizontal axis represents focus parameter. The focus parameter is a parameter for changing the focus of the scanning electron microscope. The grid pattern image entails large edge sharpness in the 0° direction and the 90° direction.

FIG. 16 is a diagram showing another example of an image of the same grid pattern. In this example, there is an astigmatism, and edges in the 0° direction are blurred (specifically, the focal points are different between the 0° direction and the 90° direction). As a result, as shown in FIG. 17, the edge sharpness in the 0° direction is smaller than that in the example of FIG. 15, and only the edge sharpness in the 90° direction has a large peak value. FIG. 18 is a diagram showing an example of an image of a line and space pattern extending in the vertical direction. In this example, as shown in FIG. 19, only the edge sharpness in the 90° direction has a large peak value.

The image shown in FIG. 16 is an image having astigmatism, and it is therefore necessary to adjust an astigmatism correction parameter of the scanning electron microscope, whereas the image shown in FIG. 18 is an image with no astigmatism. However, graphs, each representing a correlation between the edge sharpness and the focus parameter shown in FIGS. 17 and 19, are approximately similar. As a result, the image generation system recognizes the graph shown in FIG. 17 as a normal graph and mistakenly determines that the astigmatism correction parameter is correctly adjusted.

SUMMARY OF THE INVENTION

Therefore, according to an embodiment, there is provided a method capable of verifying whether the operation parameters, such as the focus parameter and the astigmatism correction parameter, of the scanning electron microscope are correctly adjusted.

Embodiments, which will be described below, relate to a method of verifying operation parameters such as a focus parameter and an astigmatism correction parameter of a scanning electron microscope.

In an embodiment, there is provided a method of verifying an operation parameter of a scanning electron microscope, comprising: determining a ratio of a length of an edge in a first direction to a length of the edge in a second direction perpendicular to the first direction, the edge being an edge of a pattern selected from design data; generating images of the pattern while changing the operation parameter of the scanning electron microscope; calculating an edge sharpness in the first direction of each of the images and calculating an edge sharpness in the second direction of each of the images; determining a ratio of a peak value of the edge sharpness in the first direction to a peak value of the edge sharpness in the second direction; and emitting an alarm if the ratio of the peak values does not coincide with the ratio of the lengths of the edge.

In an embodiment, the method further comprises applying corner-rounding process to the pattern.

In an embodiment, the operation parameter is one of a focus parameter, an astigmatism correction parameter, and a lens alignment correction parameter.

According to the above-described embodiments, the ratio of the peak values of the edge sharpness is compared with the ratio of the edge lengths of the pattern calculated from the design data. This makes it possible to correctly determine whether the operation parameter is correctly adjusted.

DESCRIPTION OF EMBODIMENTS

Hereinafter, embodiments will be described in detail with reference to the drawings.

Figure 1:
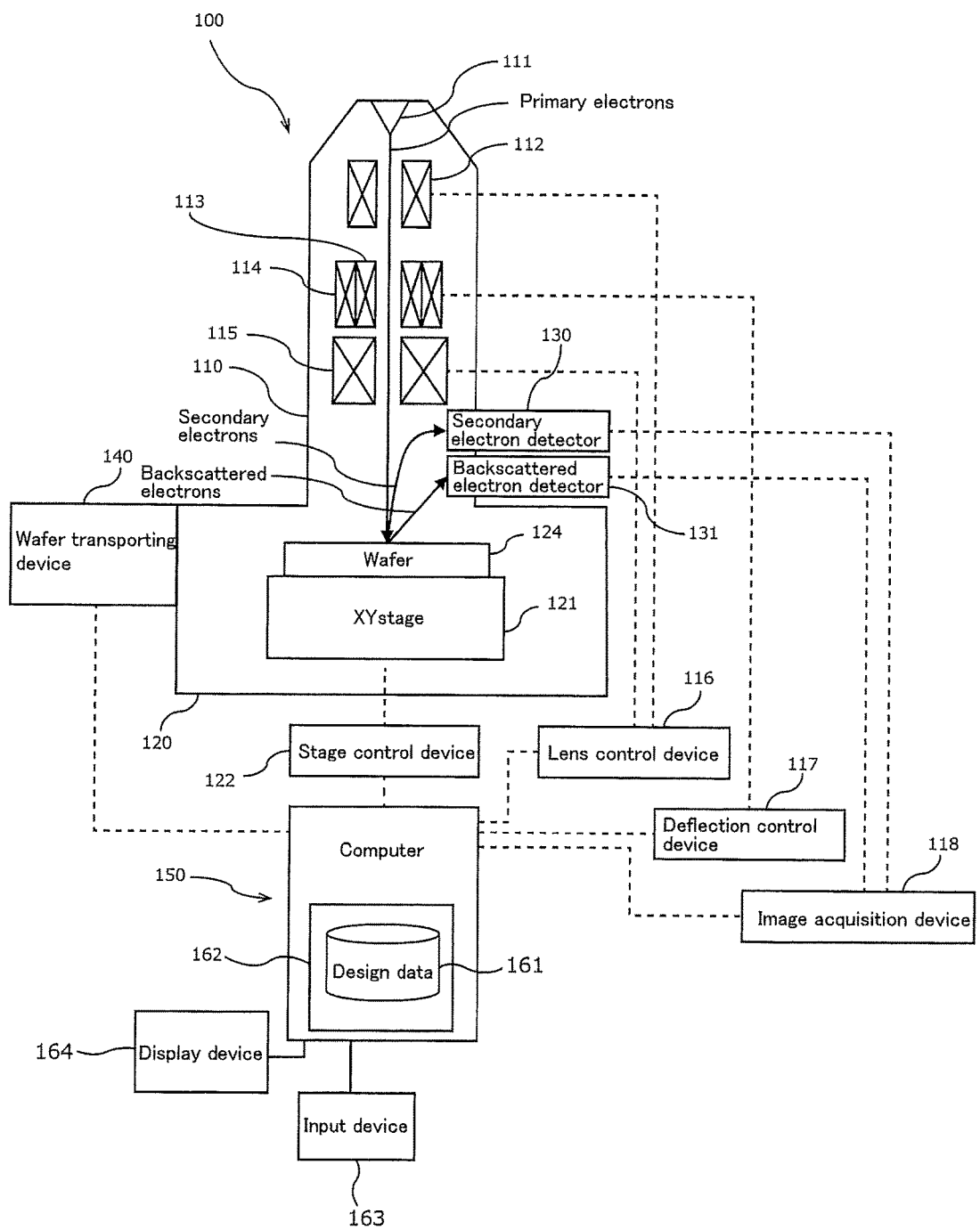
FIG. 1 is a schematic diagram showing an embodiment of an image generation system including a scanning electron microscope.

FIG. 1 is a schematic diagram showing an embodiment of an image generation system including a scanning electron microscope. As shown in FIG. 1, the image generation system includes a scanning electron microscope 100 and a computer 150 for controlling operations of the scanning electron microscope. The scanning electron microscope 100 includes an electron gun 111 that emits an electron beam composed of primary electrons (charged particles), a converging lens 112 that converges the electron beam emitted from the electron gun 111, an X deflector 113 that deflects the electron beam in an X direction, a Y deflector 114 for deflecting the electron beam in a Y direction, and an objective lens 115 for focusing the electron beam on a wafer 124 which is a specimen.

The converging lens 112 and the objective lens 115 are coupled to a lens control device 116, and operations of the converging lens 112 and the objective lens 115 are controlled by the lens control device 116. This lens control device 116 is coupled to the computer 150. The X deflector 113 and the Y deflector 114 are coupled to a deflection control device 117, and deflection operations of the X deflector 113 and the Y deflector 114 are controlled by the deflection control device 117. This deflection control device 117 is also coupled to the computer 150. A secondary electron detector 130 and a backscattered electron detector 131 are coupled to an image acquisition device 118. This image acquisition device 118 is configured to convert output signals of the secondary electron detector 130 and the backscattered electron detector 131 into an image. This image acquisition device 118 is also coupled to the computer 150.

An XY stage 121 is disposed in a specimen chamber 120. This XY stage 121 is coupled to a stage control device 122, so that the position of the XY stage 121 is controlled by the stage control device 122. This stage control device 122 is coupled to the computer 150. A wafer transporting device 140 for placing the wafer 124 onto the XY stage 121 in the specimen chamber 120 is also coupled to the computer 150.

The computer 150 includes a memory 162 in which a design database is stored, an input device 163 such as a keyboard and a mouse, and a display device 164.

The electron beam emitted from the electron gun 111 is converged by the converging lens 112, and is then focused by the objective lens 115 onto the surface of the wafer 124, while the electron beam is deflected by the X deflector 113 and the Y deflector 114. When the wafer 124 is irradiated with the primary electrons of the electron beam, secondary electrons and backscattered electrons are emitted from the wafer 124. The secondary electrons are detected by the secondary electron detector 130, and the backscattered electrons are detected by the backscattered electron detector 131. The signals of the detected secondary electrons and the signals of the backscattered electrons are input into the image acquisition device 118, and are converted into image data. The image data is transmitted to the computer 150, and an image of the wafer 124 is displayed on the display device 164 of the computer 150.

A design data of a pattern (including design information such as dimensions of pattern) of the wafer 124 is stored in advance in the memory 162. In the memory 162, a design database 161 is constructed. The design data of the pattern is stored in advance in the design database 161. The computer 150 can retrieve the design data of the pattern from the design database 161 stored in the memory 162.

Next, verification of operation parameters of the scanning electron microscope 100 will be described. The operation parameters include a focus parameter, an astigmatism correction parameter, and a lens alignment correction parameter. The focus parameter is a parameter for focusing the electron beam on the surface of the wafer, i.e., a parameter for operating the objective lens 115. The astigmatism correction parameter is a parameter for correcting (eliminating) astigmatism. More specifically, the astigmatism correction parameter is a parameter for operating an astigmatism corrector (which comprises a combination of octapole coils) incorporated in the X deflector 113 and the Y deflector 114. The astigmatism correction parameter is represented by a correction value for causing the astigmatism corrector to make the shape of the electron beam into a perfect circle at the same focal position. The lens alignment correction parameter is a parameter for axial alignment of the electron beam, i.e., a parameter for operating a beam position corrector (not shown) incorporated in the X deflector 113 and the Y deflector 114.

Figure 2:
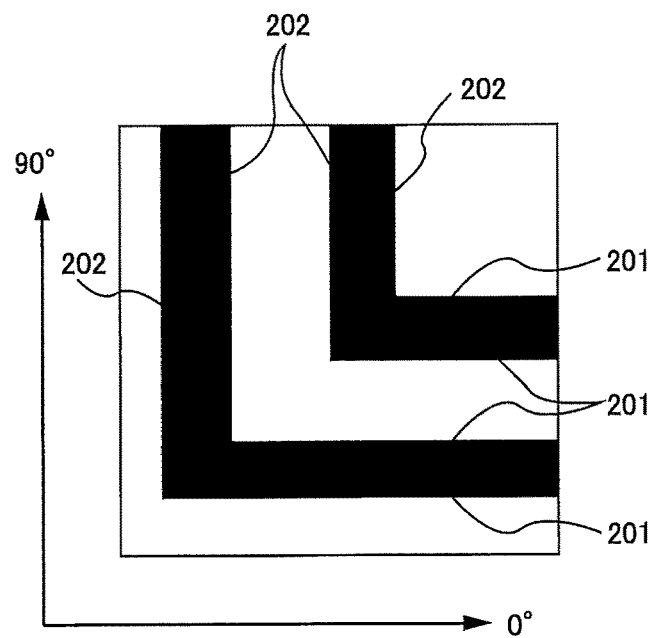
FIG. 2 is a schematic diagram showing an example of a pattern selected from design data.
Figure 3:
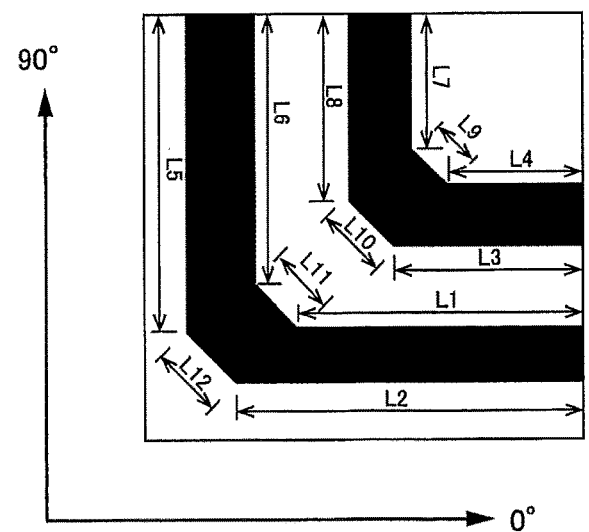
FIG. 3 is a schematic diagram showing a pattern that has been subjected to corner-rounding process.

FIG. 2 is a schematic diagram showing an example of a pattern selected from the design data. The pattern shown in FIG. 2 is composed of edges 201, 202 extending in a first direction and a second direction, i.e., a 0° direction and a 90° direction, which are perpendicular to each other. In this example, the horizontal direction is defined as an angle of 0°. The computer 150 reads the design data from the design database 161, and a user selects a pattern from the design data. As shown in FIG. 3, the computer 150 performs a corner-rounding process on the selected pattern to generate edges extending in a 45° direction and/or a 135° direction at corners. The reason for performing this corner-rounding process is to use a pattern close to the shape of the actual pattern when verifying whether the operation parameters are correctly adjusted. In the present embodiment, the first direction is a direction of an angle of 0° shown in FIG. 2, and the second direction is a direction of an angle of 90° shown in FIG. 2. In one embodiment, the first direction may be a direction of an angle of 45° and the second direction may be a direction of an angle of 135°. In this case, in the corner-rounding process is performed to generate edges extending in the 0° direction and/or the 90° direction.

Figure 18:
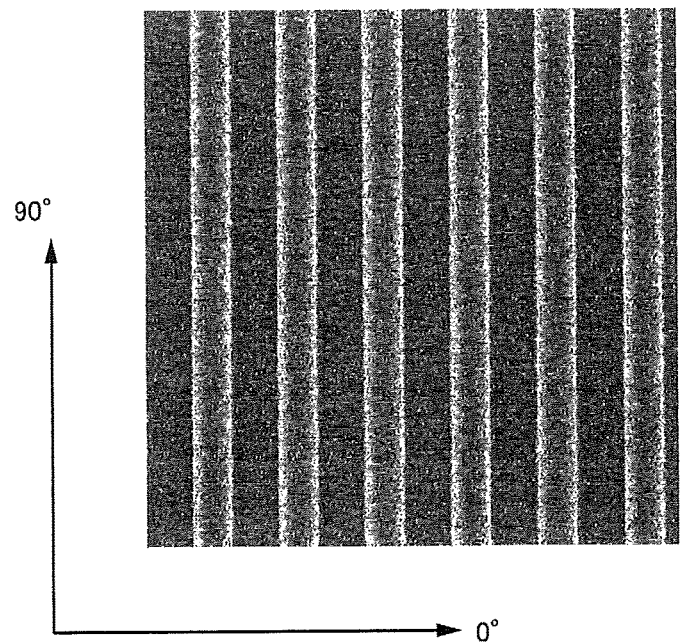
FIG. 18 is a diagram showing an example of an image of a line and space pattern extending in a vertical direction.
Figure 19:
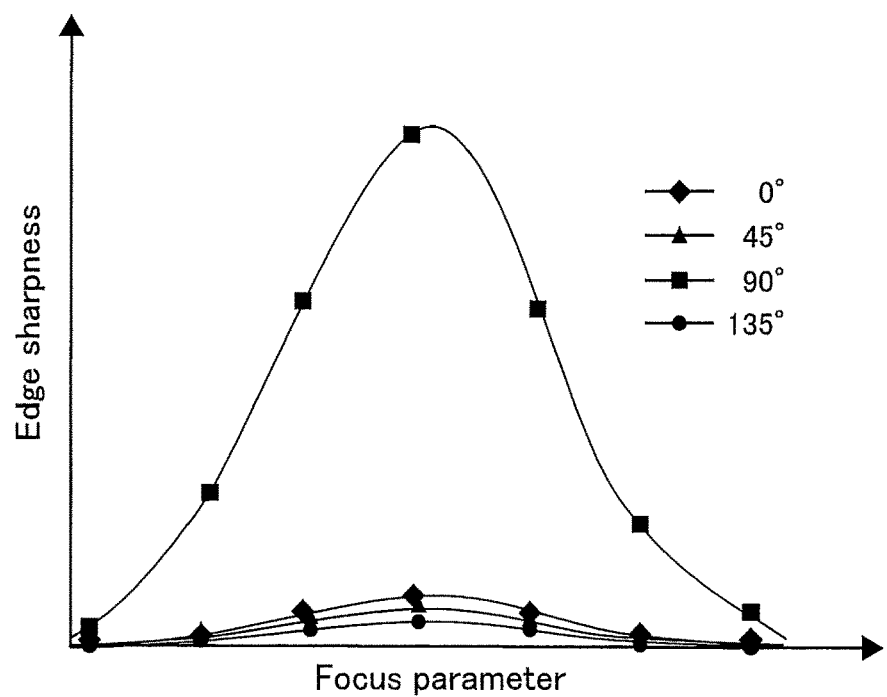
FIG. 19 is a diagram showing edge sharpness in four directions of 0°, 90°, 45°, and 135° of the pattern image shown in FIG. 18.

In the present embodiment, a pattern having edges extending in the first and second directions, i.e., the 0° direction and the 90° direction, which are perpendicular to each other, is selected from the design data, while the present invention is not limited to this embodiment. In one embodiment, a pattern having only edges extending in one direction may be selected from the design data. For example, a pattern selected from the design data may be a line and space pattern having only edges extending in the 90° direction as shown in FIG. 18.

The computer 150 calculates a total length T1 of edges extending in the 0° direction, a total length T2 of edges extending in the 90° direction, a total length T3 of edges extending in the 45° direction, and a total length T4 of edges extending in the 135° direction of the pattern to which the corner-rounding process has been applied. In the example shown in FIG. 3, the total length T1 is the sum of lengths L1, L2, L3, and L4 of the edges extending in the 0° direction, the total length T2 is the sum of lengths L5, L6, L7, and L8 of the edges extending in the 90° direction, the total length T3 is 0, and the total length T4 is the sum of lengths L9, L10, L11, and L12 of the edges extending in the 135° direction. A ratio T1:T2:T3:T4 of these total lengths corresponds to a ratio of the edge lengths of the pattern.

Figure 4:
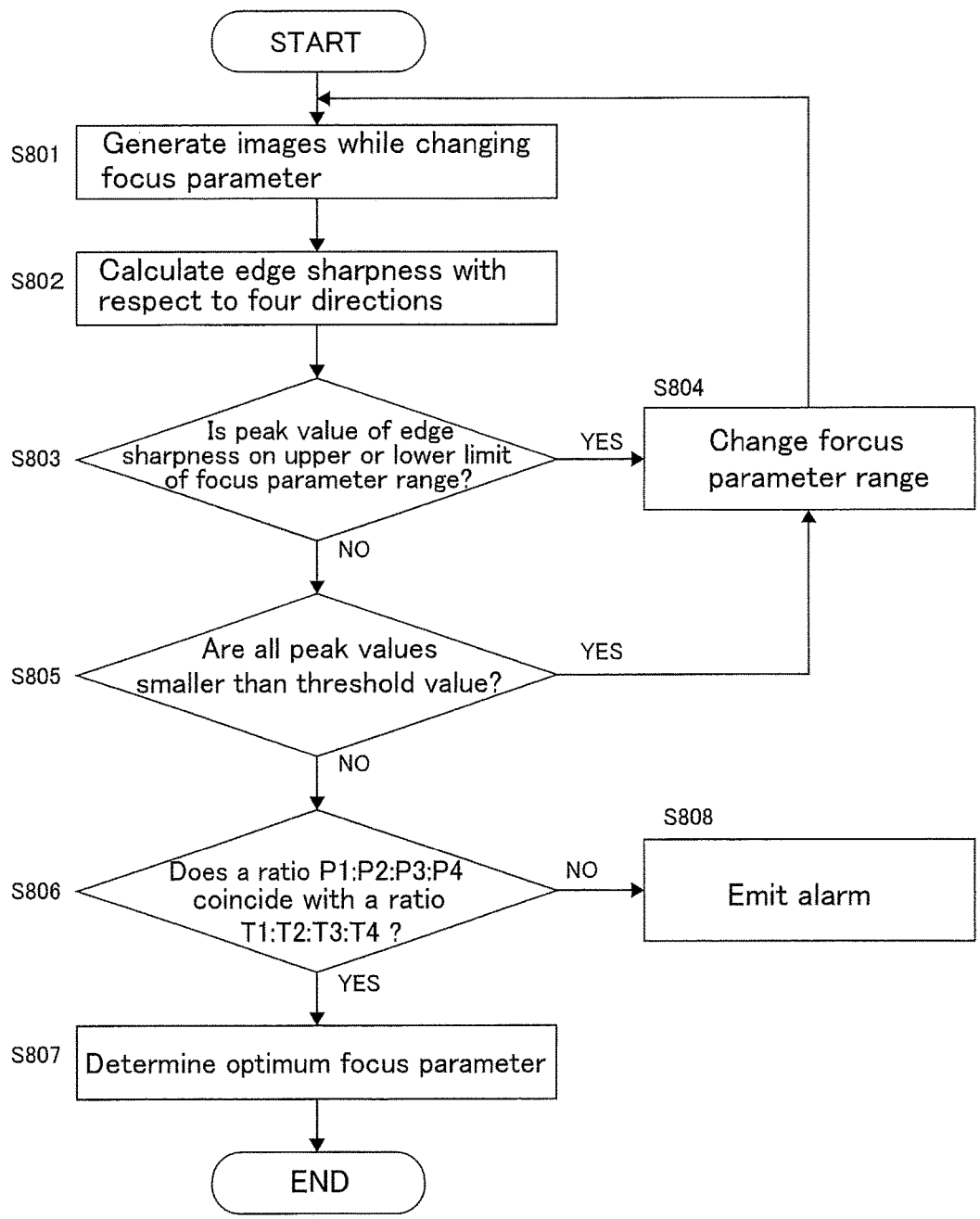
FIG. 4 is a flowchart for explaining a method of verifying a focus parameter which is one of operation parameters.

FIG. 4 is a flowchart for explaining a method of verifying the focus parameter which is one of the operation parameters. In step 801, the computer 150 instructs the scanning electron microscope 100 to generate a set number of images of the pattern shown in FIG. 2 while changing the focus parameter within a focus parameter range R1 to R2. The computer 150 obtains the generated images from the scanning electron microscope 100. In step 802, the computer 150 calculates edge sharpness with respect to four directions (i.e., directions of 0°, 90°, 45°, 135°) of the plurality of images. More specifically, the computer 150 calculates an edge sharpness in the 0° direction, an edge sharpness in the 90° direction, an edge sharpness in the 45° direction, and an edge sharpness in the 135° direction of each of the images.

Figure 5:
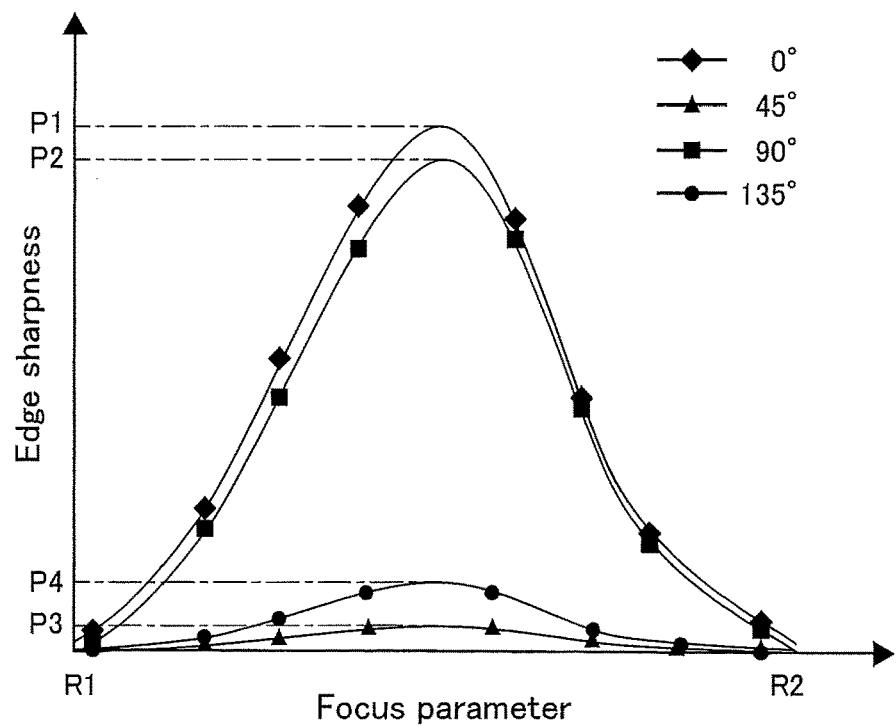
FIG. 5 is a graph showing a correlation between edge sharpness and focus parameter.

The edge sharpness is an index value indicating whether an edge of a pattern appears sharply on an image. The edge sharpness is obtained by scanning the image in a direction perpendicular to a direction in which the edge extends to obtain brightnesses, calculating derivative values of the brightnesses, and adding up the obtained derivative values. For example, the edge sharpness in the 0° direction is obtained by scanning the image in the direction of 90° to obtain brightnesses, calculating derivative values of the brightnesses, and adding up the obtained derivative values. The computer 150 further produces a graph showing a correlation between the edge sharpness and the focus parameter as shown in FIG. 5.

Figure 6:
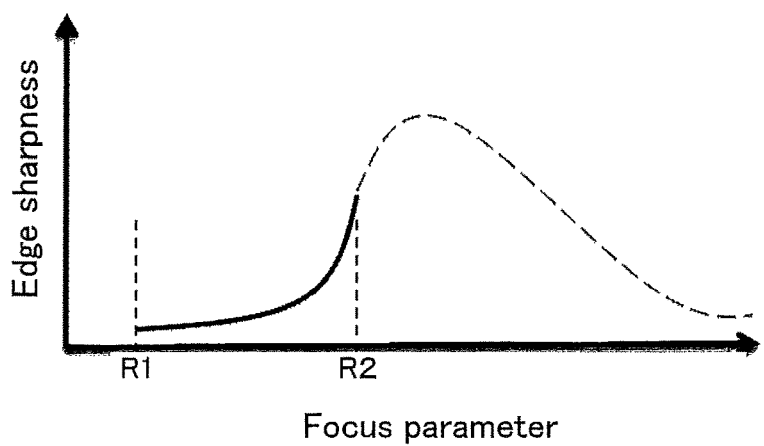
FIG. 6 a diagram illustrating that a larger peak value exists outside a focus parameter range.

In step 803, the computer 150 determines a peak value P1 of the edge sharpness in the 0° direction, a peak value P2 of the edge sharpness in the 90° direction, a peak value P3 of the edge sharpness in the 45° direction, and a peak value P4 of the edge sharpness in the 135° direction, determines the largest peak value among these peak values P1, P2, P3, P4, and determines whether this largest peak value is located at an upper limit or a lower limit of the focus parameter range R1 to R2. If the peak value P1 is located at the upper limit or the lower limit of the focus parameter range R1 to R2, it is expected that a larger peak value exists outside the focus parameter range R1 to R2 as shown in FIG. 6. If YES in the step 803, the computer 150 changes the focus parameter range R1 to R2 (step 804). Thereafter, the processing flow returns to the step 801.

Figure 7:
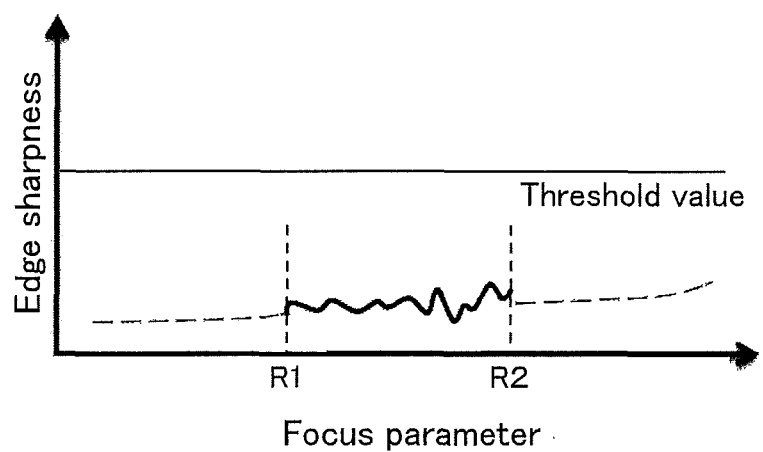
FIG. 7 a diagram showing an example in which all of peak values of edge sharpness are less than a threshold value.

If NO in the step 803, the computer 150 determines in step 805 whether all of the four peak values P1, P2, P3, P4 are less than a threshold value. As shown in FIG. 7, when all of the peak values P1, P2, P3, and P4 are less than the threshold value, it is considered that the peak values P1, P2, P3, and P4 are caused by noise. In this case, the computer 150 changes the focus parameter range R1 to R2 (step 804). Thereafter, the processing flow returns to the step 801.

If NO in the step 805, in step 806, the computer 150 determines whether the ratio P1:P2:P3:P4 of the peak values of the edge sharpness coincides with the ratio T1:T2:T3:T4 of the edge lengths that has been calculated previously. The peak value ratio P1:P2:P3:P4 is not needed to completely coincide with the edge length ratio T1:T2:T3:T4, and a difference therebetween within a preset range is allowed.

If the ratio P1:P2:P3:P4 of the peak values coincides with the ratio T1:T2:T3: T4 of the edge lengths in the above step 806, the computer 150 determines an optimum focus parameter (step 807). Specifically, the computer 150 calculates an average of four focus parameters corresponding to the peak values P1, P2, P3, and P4, and determines the optimum focus parameter which comprises the average obtained. Thereafter, the process flow ends.

If the peak value ratio P1:P2:P3:P4 does not coincide with the edge length ratio T1:T2:T3:T4 in the step 806, the computer 150 emits an alarm (step 808). The reason why the two ratios do not coincide with each other may be that operation parameters, other than the focus parameters, are not appropriate. If the alarm is emitted, it is desirable to adjust the following astigmatism correction parameter.

Figure 8:
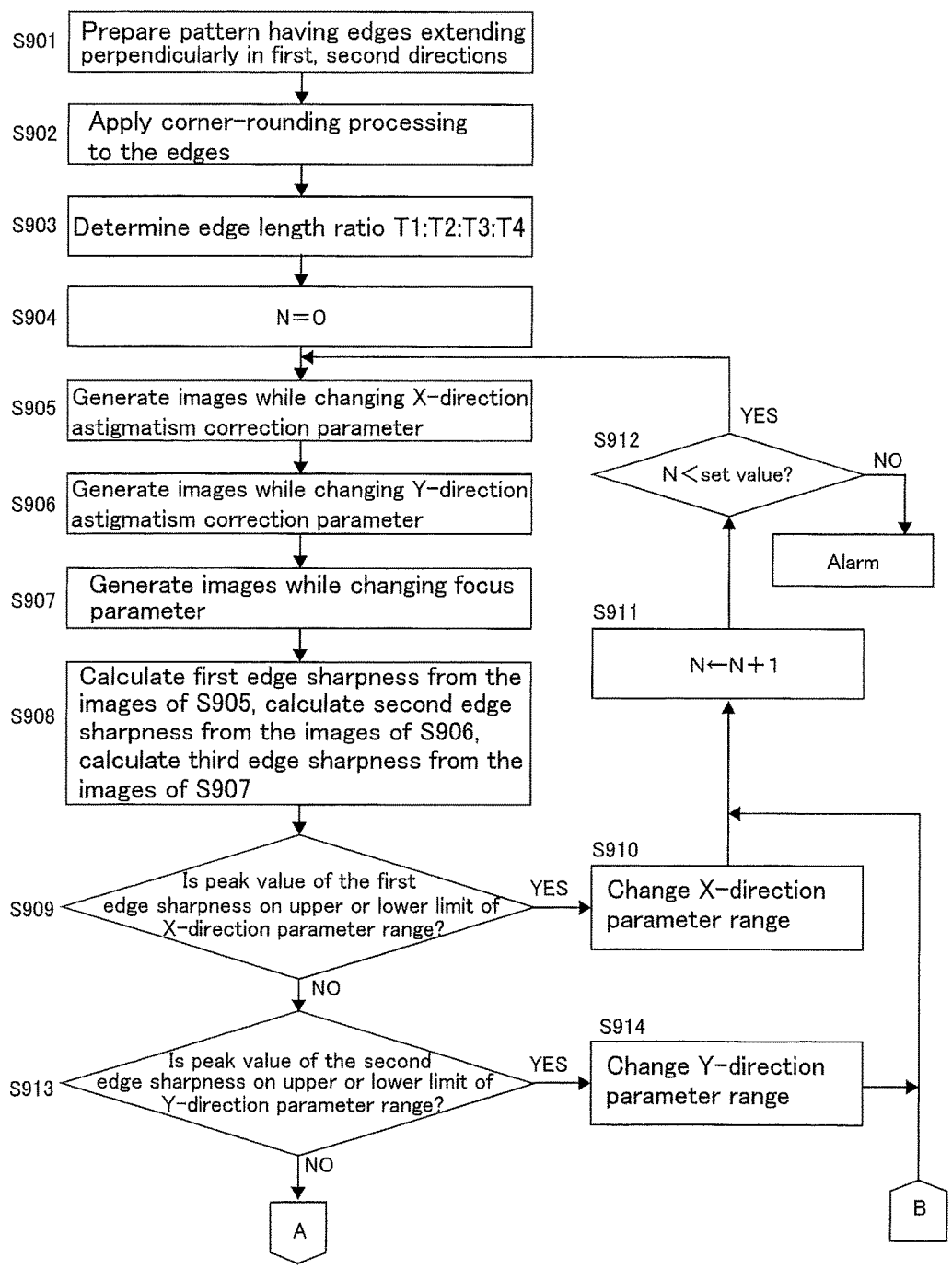
FIG. 8 is a first half of a flowchart for explaining a method of verifying an astigmatism correction parameter which is one of operation parameters.
Figure 9:
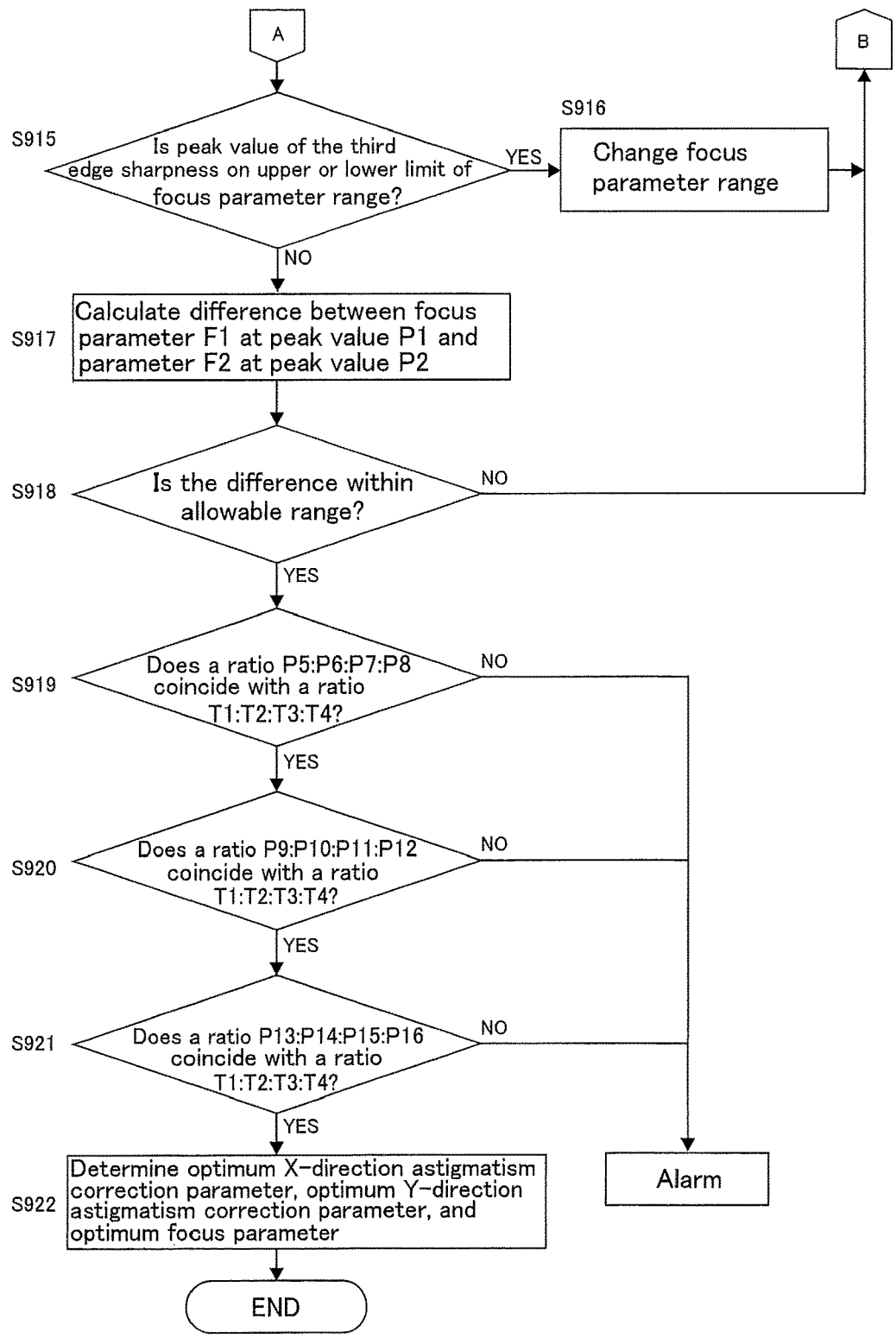
FIG. 9 is a latter half of the flowchart shown in FIG. 8.

FIG. 8 is a flowchart illustrating a method of verifying the astigmatism correction parameter, which is one of the operation parameters. In step 901, a pattern having edges extending in the first direction and the second direction, which are perpendicular to each other, is prepared. The pattern is selected from the design data by a user, and the computer 150 checks whether the selected pattern has edges extending in the first direction and the second direction which are perpendicular to each other. This is because, in order to correct the astigmatism, the pattern is required to have mutually perpendicular edges. In the present embodiment, the first direction is a direction of an angle of 0° shown in FIG. 2, and the second direction is a direction of an angle of 90° shown in FIG. 2. In one embodiment, the first direction may be a direction of an angle of 45° and the second direction may be a direction of an angle of 135°.

In step 902, the computer 150 applies the corner-rounding process, described with reference to FIG. 3, to the pattern selected from the design data in the step 901. In step 903, the computer 150 calculates a total length T1 of edges extending in the 0° direction, a total length T2 of edges extending in the 90° direction, a total length T3 of edges extending in the direction of 45°, and a total length T4 of edges extending in the 135° direction of the pattern to which the corner-rounding process has been applied. The computer 150 determines a ratio of these total lengths, i.e., a ratio of edge lengths T1:T2:T3:T4.

In step 904, the computer 150 sets N to 0, which represents the number of repetitions of process. In step 905, the computer 150 instructs the scanning electron microscope 100 to generate a set numbers of images of the pattern prepared in the step 901, while changing an X-direction astigmatism correction parameter within an X-direction parameter range X1 to X2. In step 906, the computer 150 instructs the scanning electron microscope 100 to generate a set numbers of images of the pattern prepared in the step 901, while changing a Y-direction astigmatism correction parameter within a Y-direction parameter range Y1 to Y2.

The X-direction astigmatism correction parameter is a parameter for correcting (eliminating) the astigmatism in the X direction, i.e., a parameter for operating the astigmatism corrector incorporated in the X deflector 113 shown in FIG. 1. When the X-direction astigmatism correction parameter is changed, the thickness of the lens in the X direction, i.e., a blur of an image in the X direction changes. The Y-direction astigmatism correction parameter is a parameter for correcting (eliminating) the astigmatism in the Y direction, i.e., a parameter for operating the astigmatism corrector incorporated in the Y deflector 114 shown in FIG. 1. When the Y-direction astigmatism correction parameter is changed, the thickness of the lens in the Y direction, i.e., a blur of an image in the Y direction changes. The X direction of the X-direction astigmatism correction parameter and the Y direction of the Y-direction astigmatism correction parameter are perpendicular to each other.

In step 907, the computer 150 instructs the scanning electron microscope 100 to generate a set numbers of images of the pattern prepared in the step 901, while changing the focus parameter within a focus parameter range R1 to R2. The computer 150 obtains the images that have been generated in the steps 905, 906, 907 from the scanning electron microscope 100.

Figure 10:
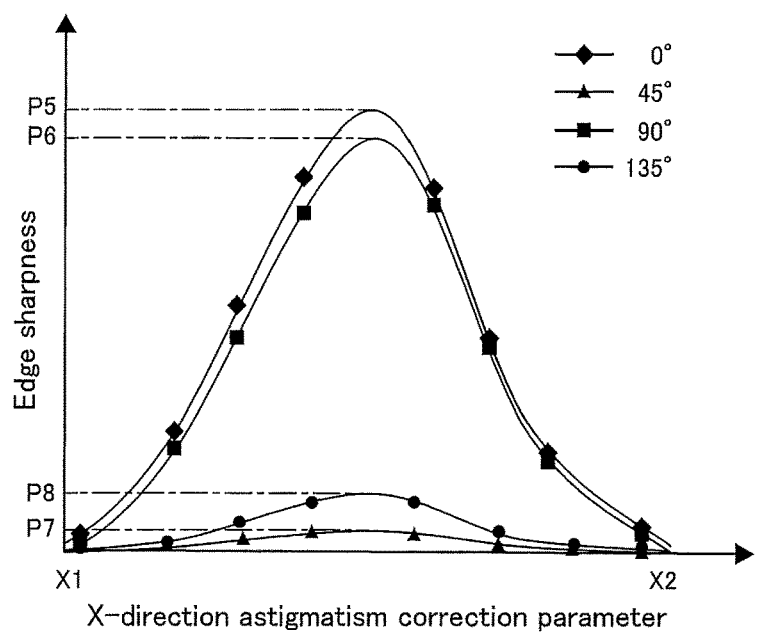
FIG. 10 is a graph showing a correlation between edge sharpness and X-direction astigmatism correction parameter.

In step 908, the computer 150 calculates the edge sharpness with respect to the four directions (i.e., the directions of 0°, 90°, 45°, 135°) of the plurality of images obtained in the steps 905, 906, and 907. More specifically, the computer 150 scans the plurality of images obtained in the step 905 in the four directions, and calculates an edge sharpness in the 0° direction, an edge sharpness in the 90° direction, an edge sharpness in the 45° direction, and an edge sharpness in the 135° direction of each of the images. The computer 150 creates a graph showing a correlation between the edge sharpness and the X-direction astigmatism correction parameter as shown in FIG. 10. In the following description, the edge sharpness calculated from the plurality of images obtained in the step 905 is referred to as a first edge sharpness.

Figure 11:
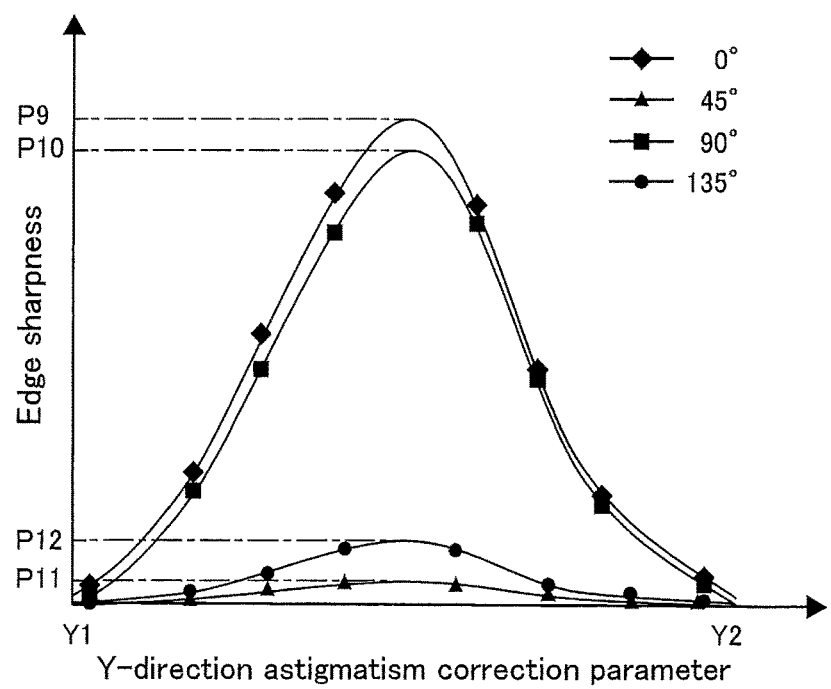
FIG. 11 is a graph showing a correlation between edge sharpness and Y-direction astigmatism correction parameter.

Similarly, the computer 150 scans the plurality of images obtained in the step 906 in the four directions, and calculates an edge sharpness in the 0° direction, an edge sharpness in the 90° direction, an edge sharpness in the 45° direction, and an edge sharpness in the 135° direction of each of the images. The computer 150 creates a graph showing a correlation between the edge sharpness and the Y-direction astigmatism correction parameter as shown in FIG. 11. In the following description, the edge sharpness calculated from the plurality of images obtained in the step 906 is referred to as a second edge sharpness.

Figure 12:
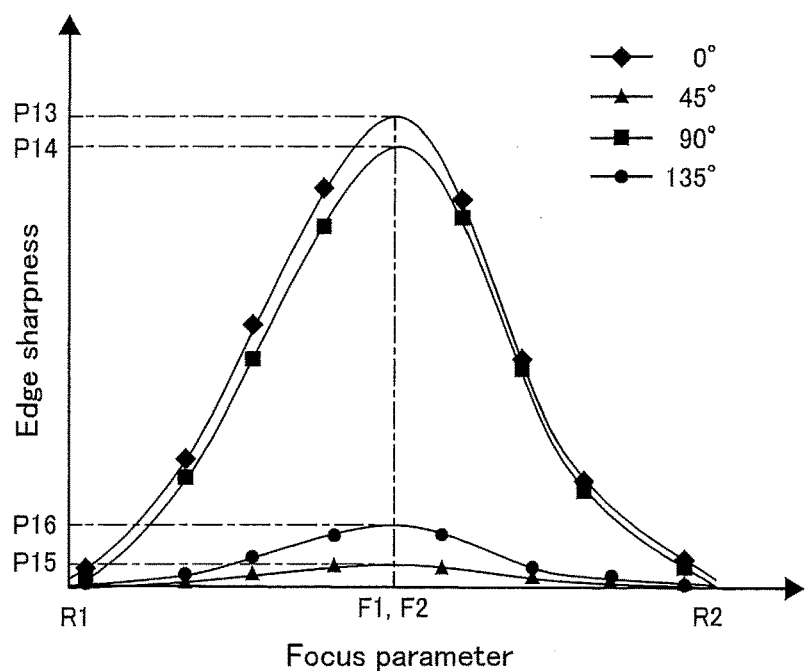
FIG. 12 is a graph showing an example of a correlation between edge sharpness and focus parameter.

Further, the computer 150 scans the plurality of images obtained in the step 907 in the four directions, and calculates an edge sharpness in the 0° direction, an edge sharpness in the 90° direction, an edge sharpness in the 45° direction, and an edge sharpness in the 135° direction of each of the images. The computer 150 creates a graph showing a correlation between the edge sharpness and the focus parameter as shown in FIG. 12. In the following description, the edge sharpness calculated from the plurality of images obtained in the step 907 is referred to as a third edge sharpness.

In step 909, the computer 150 determines a peak value P5 of the first edge sharpness in the 0° direction, a peak value P6 of the first edge sharpness in the 90° direction, a peak value P7 of the first edge sharpness in the 45° direction, and a peak value P8 of the first edge sharpness in the 135° direction. The computer 150 determines the largest peak value among these peak values P5, P6, P7, P8, and determines whether this largest peak value is located at the upper limit or the lower limit of the X-direction parameter range X1 to X2. If the largest peak value is located at the upper limit or the lower limit of the X-direction parameter range X1 to X2, it is expected that a larger peak value exists outside the X-direction parameter range X1 to X2.

If YES in the step 909, the computer 150 changes the X-direction parameter range X1 to X2 in step 910. Further, in step 911, the computer 150 adds 1 to N to update the numerical value of N. On condition that N is smaller than a set value (step 912), the process flow returns to the step 905. If N reaches the set value at the step 912, the computer 150 issues an alarm.

If NO in the step 909, in step 913, the computer 150 determines a peak value P9 of the second edge sharpness in the 0° direction, a peak value P10 of the second edge sharpness in the 90° direction, a peak value P11 of the second edge sharpness in the 45° direction, and a peak value P12 of the second edge sharpness in the 135° direction. The computer 150 determines the largest peak value among these peak values P9, P10, P11, P12, and determines whether this largest peak value is located at the upper limit or the lower limit of the Y-direction parameter range Y1 to Y2. If the largest peak value is located at the upper or lower limit of the Y-direction parameter range Y1 to Y2, it is expected that there is a larger peak value outside the Y-direction parameter range Y1 to Y2.

If YES in the step 913, the computer 150 changes the Y-direction parameter range Y1 to Y2 in step 914. Thereafter, the processing flow proceeds to the above step 911. In the step 911, the computer 150 adds 1 to N to update the numerical value of N. On condition that N is smaller than the set value (step 912), the process flow returns to the step 905.

If NO in the step 913, in step 915, the computer 150 determines a peak value P13 of the third edge sharpness in the 0° direction, a peak value P14 of the third edge sharpness in the 90° direction, a peak value P15 of the third edge sharpness in the 45° direction, and a peak value P16 of the third edge sharpness in the 135° direction. The computer 150 determines the largest peak value among these peak values P13, P14, P15, P16, and determines whether this largest peak value is located at the upper limit or the lower limit of the focus parameter range R1 to R2. If the largest peak value is located at the upper or lower limit of the focus parameter range R1 to R2, it is expected that there is a larger peak value outside the focus parameter range R1 to R2.

If YES in the step 915, the computer 150 changes the focus parameter range R1 to R2 in step 916. Thereafter, the processing flow proceeds to the above step 911. In the step 911, the computer 150 adds 1 to N to update the numerical value of N. On condition that N is smaller than the set value (step 912), the process flow returns to the step 905.

Figure 13:
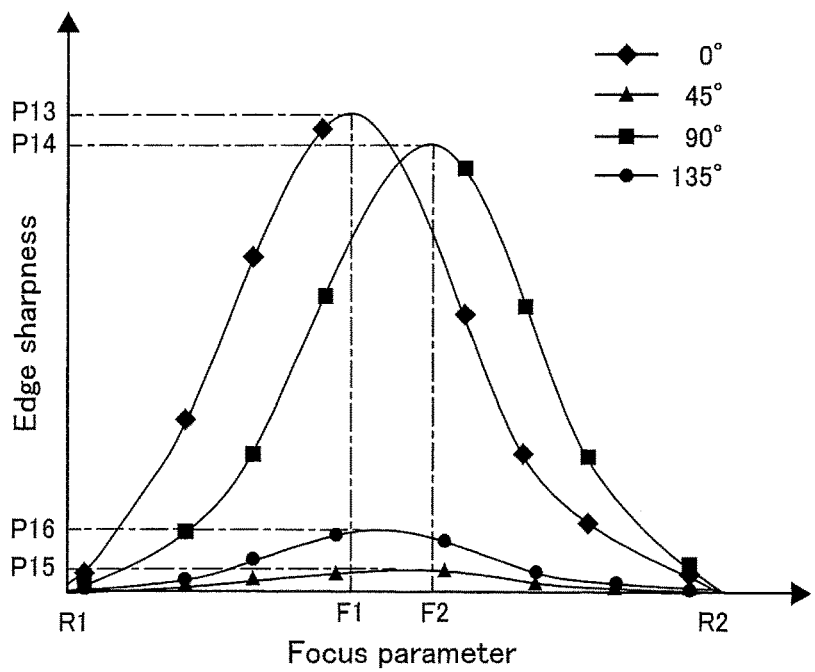
FIG. 13 is a graph showing another example of a correlation between edge sharpness and focus parameter.
Figure 14:
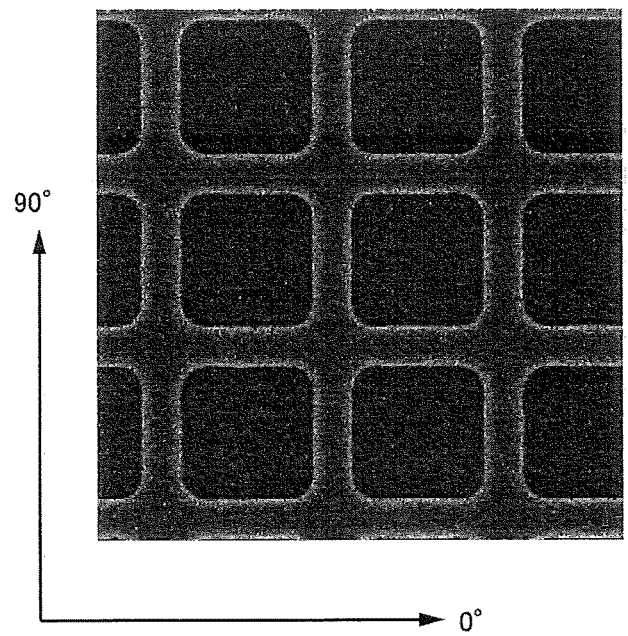
FIG. 14 is a diagram showing an example of an image of a grid pattern generated by a scanning electron microscope.
Figure 15:
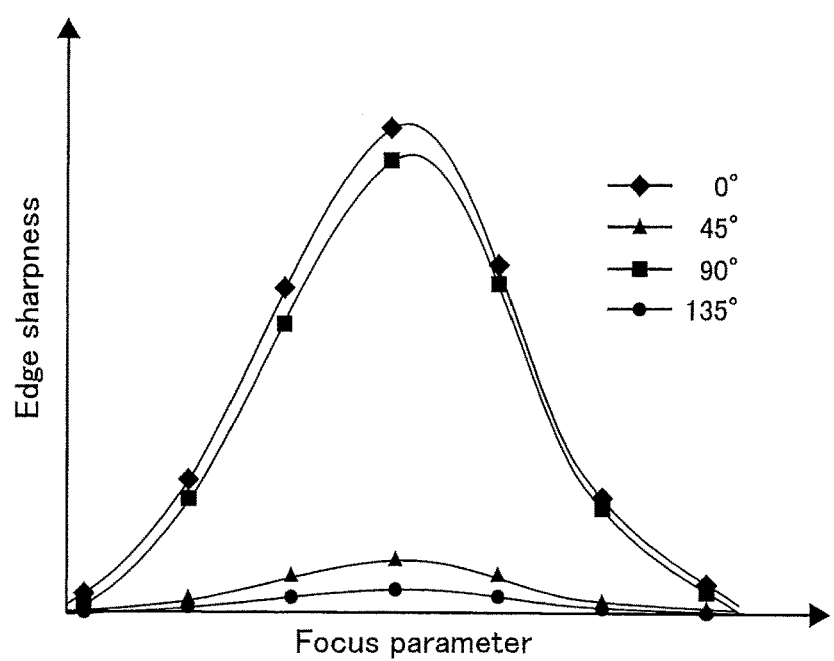
FIG. 15 is a diagram showing edge sharpness in four directions of 0°, 90°, 45°, and 135° of the pattern image shown in FIG. 14.
Figure 16:
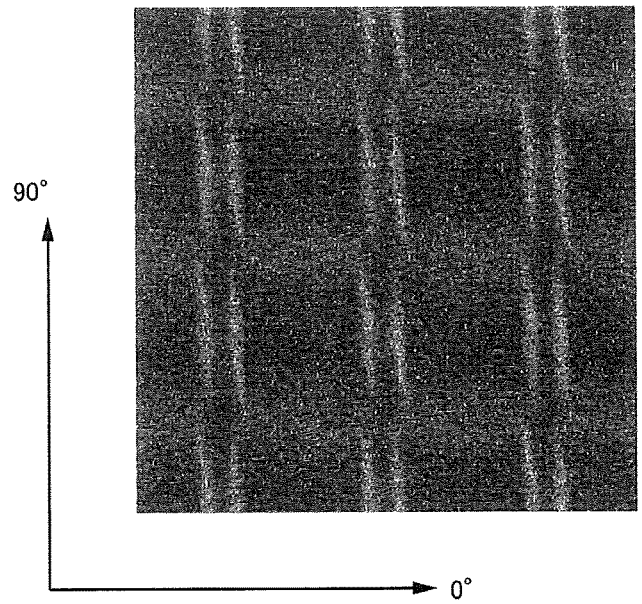
FIG. 16 is a diagram showing another example of an image of the same grid pattern.
Figure 17:
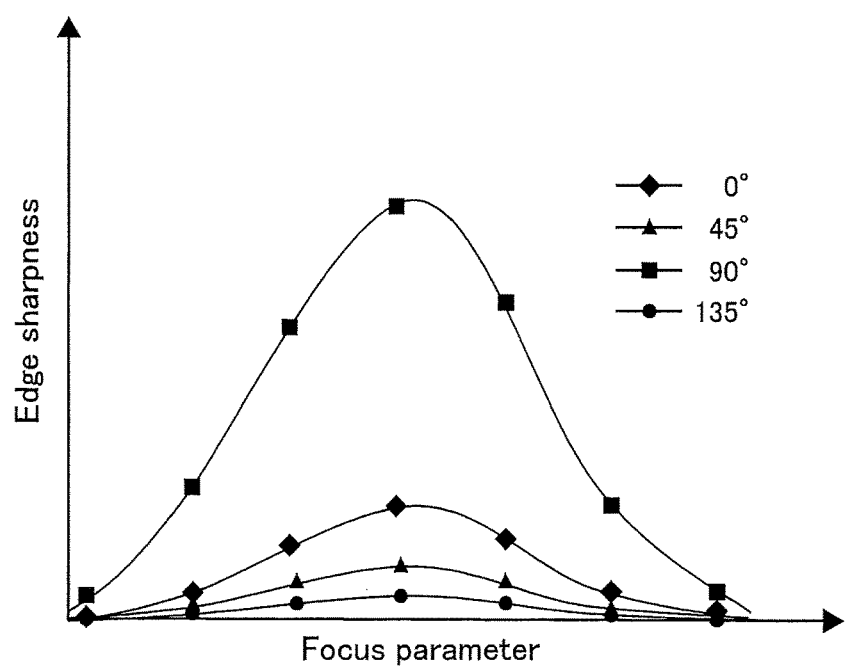
FIG. 17 is a diagram showing edge sharpness in four directions of 0°, 90°, 45°, and 135° of the pattern image shown in FIG. 16.

If NO in the step 915, in step 917 the computer 150 calculates a difference between a focus parameter F1 corresponding to the peak value P13 of the third edge sharpness in the first direction (0° direction) and a focus parameter F2 corresponding to the peak value P14 of the third edge sharpness in the second direction (90° direction). In step 918, the computer 150 determines whether the difference calculated in the step 917 falls within an allowable range. In the example shown in FIG. 12, the difference between the focus parameter F1 and the focus parameter F2 falls within the allowable range, while in the example shown in FIG. 13, the difference between the focus parameter F1 and the focus parameter F2 is out of the allowable range.

If the difference between the focus parameter F1 and the focus parameter F2 is out of the allowable range, the process flow proceeds to the step 911. In the step 911, the computer 150 adds 1 to N to update the numerical value of N. On condition that N is smaller than the set value (step 912), the process flow returns to the step 905. When the difference between the focus parameter F1 and the focus parameter F2 is within the allowable range, the computer 150 determines in step 919 whether the ratio P5:P6:P7:P8 of the peak values of the first edge sharpness coincides with the previously calculated ratio T1:T2:T3:T4 of the edge lengths. The peak value ratio P5:P6:P7:P8 is not needed to completely coincide with the edge length ratio T1:T2:T3:T4, and a difference therebetween within a preset range is allowed.

If the ratio P5:P6:P7:P8 of the peak values of the first edge sharpness does not coincide with the ratio T1:T2:T3:T4 of the edge lengths, the computer 150 emits an alarm. If the ratio P5:P6:P7:P8 of the peak values coincides with the ratio T1:T2:T3:T4 of the edge lengths, the computer 150 determines in step 920 whether a ratio P9:P10:P11:P12 of the peak values of the second edge sharpness coincides with the previously calculated ratio T1:T2:T3:T4 of the edge lengths. The peak value ratio P9:P10:P11:P12 is not needed to completely coincide with the edge length ratio T1:T2:T3:T4, and a difference therebetween within a preset range is allowed.

If the ratio P9:P10:P11:P12 of the peak values of the second edge sharpness does not coincide with the ratio T1:T2:T3:T4 of the edge lengths, the computer 150 emits an alarm. If the ratio P9:P10:P11:P12 of the peak values coincides with the ratio T1:T2:T3:T4 of the edge lengths, the computer 150 determines in step 921 whether a ratio P13:P14:P15:P16 of the peak values of the third edge sharpness coincides with the previously calculated ratio T1:T2:T3:T4 of the edge lengths. The peak value ratio P13:P14:P15:P16 is not needed to completely coincide with the edge length ratio T1:T2:T3:T4, and a difference therebetween within a preset range is allowed.

If the ratio P13:P14:P15:P16 of the peak values of the third edge sharpness does not coincide with the ratio T1:T2:T3:T4 of the edge lengths, the computer 150 emits an alarm. If the ratio P13:P14:P15:P16 of the peak values coincides with the ratio T1:T2:T3:T4 of the edge lengths, in step 922, the computer 150 determines an optimum X-direction astigmatism correction parameter, an optimum Y-direction astigmatism correction parameter, and an optimum focus parameter. Specifically, the computer 150 calculates an average of the four X-direction astigmatism correction parameters corresponding respectively to the peak values P5, P6, P7, and P8 of the first edge sharpness, and determines the optimum X-direction astigmatism correction parameter that is the average obtained. Similarly, the computer 150 calculates an average of the four Y-direction astigmatism correction parameters corresponding respectively to the peak values P9, P10, P11, and P12 of the second edge sharpness, and determines the optimum Y-direction astigmatism correction parameter that is the average obtained. Further, the computer 150 calculates an average of the four focus parameters corresponding respectively to the peak values P13, P14, P15, and P16 of the third edge sharpness, and determines the optimum focus parameter that is the average obtained. Thereafter, the process flow ends.

In the above-described embodiments, the ratio of the edge lengths in the four directions and the ratio of the peak values of the edge sharpness in the four directions are obtained, while the present invention is not limited to the above-described embodiments. In one embodiment, a ratio of edge lengths in two directions, i.e., a first direction and a second direction perpendicular to each other, and peak values of edge sharpness in the first direction and the second direction may be obtained. For example, the computer 150 may determine whether a ratio P1:P2 of the peak values coincides with a ratio T1:T2 of the edge lengths.

The above-described embodiments are directed to a method of verifying whether the focus parameter and the astigmatism correction parameter are correctly adjusted. It is noted that the present invention can also be applied to a method of verifying whether or not another kind of operation parameter, such as the lens alignment correction parameter, is correctly adjusted.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A method of verifying an operation parameter of a scanning electron microscope, comprising:
    calculating a first length of an edge in a first direction and a second length of the edge in a second direction from dimensions of a pattern selected from design data for a wafer the dimensions being contained in the design data, the second direction being perpendicular to the first direction;
    determining a ratio of the first length to the second length;
    generating images of a shape on the wafer corresponding to the pattern while changing the operation parameter of the scanning electron microscope;
    calculating an edge sharpness in the first direction of each of the images and calculating an edge sharpness in the second direction of the shape in each of the images;
    determining a ratio of a peak value of the edge sharpness in the first direction to a peak value of the edge sharpness in the second direction; and
    emitting an alarm from a computer if the ratio of the peak values does not coincide with the ratio of the first length to the second length.

2. The method according to claim 1, further comprising: applying corner-rounding process to the pattern.

3. The method according to claim 1, wherein the operation parameter is one of a focus parameter, an astigmatism correction parameter, and a lens alignment correction parameter.

* * * * *